United States Patent
Maruyama et al.

(10) Patent No.: US 10,404,228 B2
(45) Date of Patent: Sep. 3, 2019

(54) TRANSCONDUCTANCE AMPLIFIER AND PHASE SHIFTER

(71) Applicant: MITSUBISHI ELECTRIC CORPORATION, Tokyo (JP)

(72) Inventors: Takaya Maruyama, Tokyo (JP); Eiji Taniguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/744,637

(22) PCT Filed: Oct. 29, 2015

(86) PCT No.: PCT/JP2015/080548
§ 371 (c)(1),
(2) Date: Jan. 12, 2018

(87) PCT Pub. No.: WO2017/072911
PCT Pub. Date: May 4, 2017

(65) Prior Publication Data
US 2018/0212576 A1   Jul. 26, 2018

(51) Int. Cl.
| | |
|---|---|
| H03F 3/45 | (2006.01) |
| H03F 1/32 | (2006.01) |
| H03F 3/72 | (2006.01) |
| H03D 7/14 | (2006.01) |
| H03H 11/20 | (2006.01) |

(52) U.S. Cl.
CPC ............ *H03F 3/45* (2013.01); *H03D 7/1441* (2013.01); *H03D 7/1458* (2013.01); *H03D 7/1466* (2013.01); *H03F 1/3211* (2013.01); *H03F 3/45183* (2013.01); *H03F 3/72* (2013.01); *H03F 2203/45018* (2013.01); *H03F 2203/45306* (2013.01); *H03F 2203/45318* (2013.01); *H03F 2203/45504* (2013.01);
(Continued)

(58) Field of Classification Search
CPC .... H03F 3/45; H03F 3/45165; H03F 3/45264; H03F 3/45461; H03G 3/30
USPC .................................................. 330/253, 254
See application file for complete search history.

(56) References Cited

U.S. PATENT DOCUMENTS

| | | |
|---|---|---|
| 8,903,342 B1 | 12/2014 | Wyse et al. |
| 9,667,235 B1 * | 5/2017 | Wyse ...................... H03K 5/13 |
| 2011/0140964 A1 | 6/2011 | Kim et al. |

OTHER PUBLICATIONS

Yan et al. "A 3.5 GHz Phase Shifter of High Input Power Range with Digitally Controlled VGA", RFIT2011—IEEE International Symposium on Radio-Frequency Integration Technology, Nov. 30-Dec. 2, 2011, Beijing, China, pp. 29-32.
(Continued)

*Primary Examiner* — Steven J Mottola
(74) *Attorney, Agent, or Firm* — Birch, Stewart, Kolasch & Birch, LLP

(57) ABSTRACT

A transconductance amplifier is provided with: a cross-coupled differential pair (31) having one set of differential pair transistors in which signals whose polarities are opposite to each other are inputted to gates thereof, drains of one of the differential pair transistors being connected to drains of another one of the differential pair transistors, and a control circuit (32) comprised of logical circuits, for outputting a binary signal to the common source of each of the differential pair transistors on the basis of an output-level control signal and a polarity control signal which are inputted thereto.

9 Claims, 10 Drawing Sheets

(52) U.S. Cl.
CPC .............. *H03F 2203/45506* (2013.01); *H03F 2203/45611* (2013.01); *H03F 2203/7206* (2013.01); *H03H 11/20* (2013.01)

(56) References Cited

OTHER PUBLICATIONS

Extended European Search Report issued in European Application No. 15907275.0 dated Oct. 1, 2018.
Yu Pei et al.; "A Phase-Shifting Up-Converter for 30GHz Phased Array Applications"; 2012 IEEE Radio Frequency Integrated Circuits Symposium (RFIC); Jun. 17-19, 2012, pp. 499-502.

\* cited by examiner

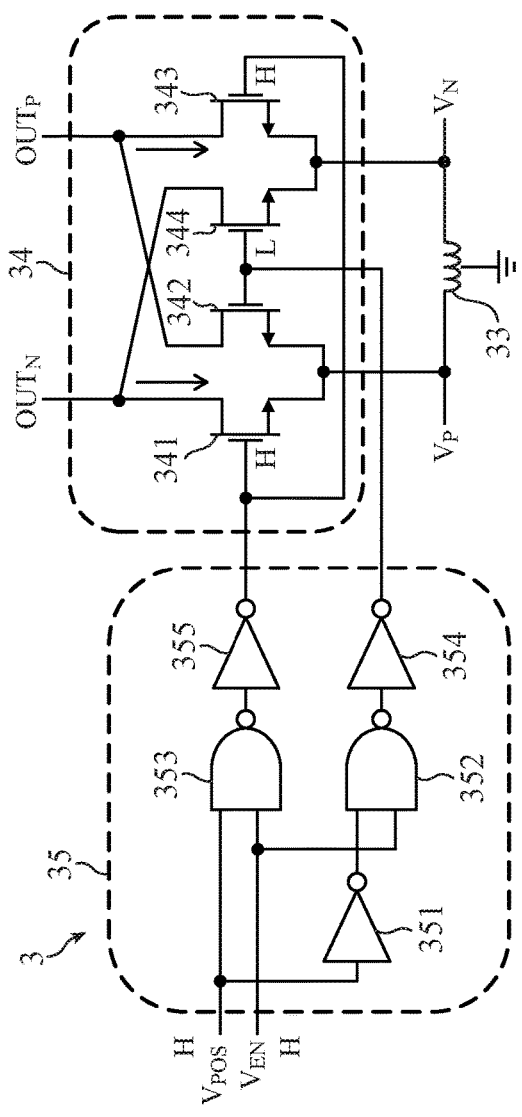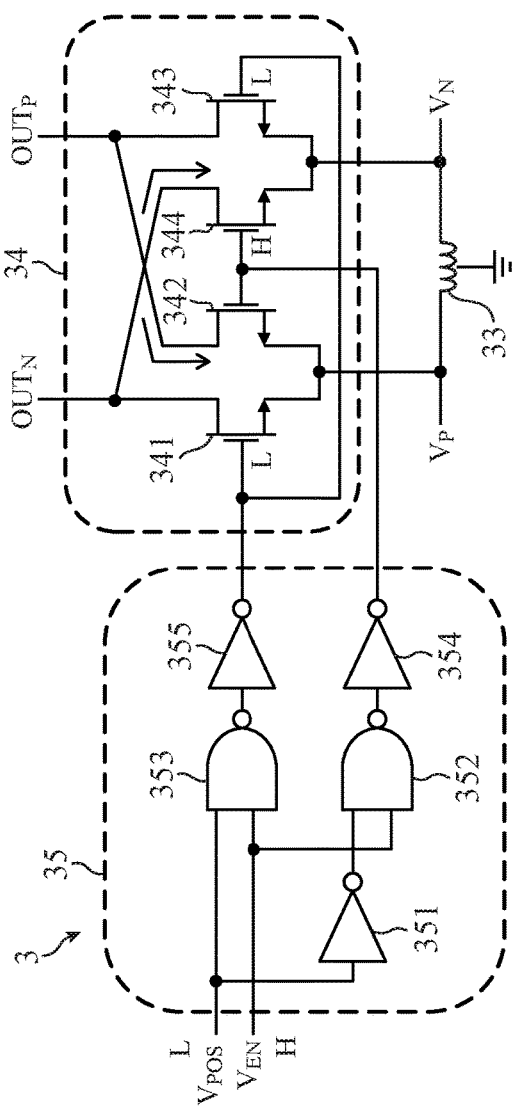
FIG. 12A
FIG. 12B

TRANSCONDUCTANCE AMPLIFIER AND PHASE SHIFTER

TECHNICAL FIELD

The present invention relates to a transconductance amplifier having an output-level control function and a polarity control function, and a phase shifter using the transconductance amplifier.

BACKGROUND ART

In a phased array radar, in order to change the beam direction, a phase shifter is needed. As one example of this phase shifter, there is a phase shifter of vector composite type having transconductance amplifiers (for example, refer to Nonpatent Literature 1). Each transconductance amplifier has a source-grounded polarity control stage, and an amplification stage located as an upper stage of the polarity control stage. In the phase shifter of vector composite type, an in-phase component (an I signal) and a quadrature-phase component (a Q signal) of an input signal are applied to the amplification stages of separate transconductance amplifiers, and the outputs of the amplification stages are connected to the same load.

CITATION LIST

Non Patent Literature

Non Patent Literature 1: T. C. Yan, W. Z. Lin, and C. N. Kuo, "A 3.5 GHz phase shifter of high input power range with digitally controlled VGA," 2011 IEEE Int. Symp. Radio-Frequency Integr. Technol. RFIT 2011, pp. 29-32, 2011.

SUMMARY OF INVENTION

Technical Problem

In a transconductance amplifier used for such a conventional phase shifter as disclosed by Nonpatent Literature 1, an amplification stage is disposed as an upper stage of a source-grounded polarity control stage, and it is necessary to make the number of vertically stacked stages be at least two. Therefore, there occurs a malfunction that when the source potential is reduced to a ground potential (ground level) in order to increase the swing width of each drain voltage of the amplification stage, the output is no longer provided. Therefore, it is necessary to cause the polarity control stage and the amplification stage to operate under saturation conditions, and apply a voltage of approximately several hundred mV to between the drain and the source of the transistor. A problem is therefore that the upper limit on the swing width of each drain voltage is low, and the linearity is low.

The present invention is made in order to solve the above-mentioned problems, and it is therefore an object of the present invention to provide a transconductance amplifier and a phase shifter that can widen the swing width of each drain voltage of an amplification stage and can improve the linearity, as compared with conventional configurations.

Solution to Problem

According to the present invention, there is provided a transconductance amplifier including: a cross-coupled differential pair having one set of differential pair transistors in which signals whose polarities are opposite to each other are inputted to gates thereof, drains of one of the differential pair transistors being connected to drains of another one of the differential pair transistors; and a control circuit comprised of logical circuits, for outputting binary signals to common sources of the respective differential pair transistors on a basis of an output-level control signal and a polarity control signal which are inputted thereto, the output-level control signal being a binary signal for controlling presence or absence of an output of the cross-coupled differential pair and the polarity control signal being a binary signal for controlling a polarity of the output of the cross-coupled differential pair.

Advantageous Effects of Invention

According to the present invention, because of the above configuration, the swing width of each drain voltage of the amplification stage can be widened and the linearity can be improved, as compared with conventional configurations.

BRIEF DESCRIPTION OF DRAWINGS

FIG. 3A is a diagram showing a current output state, and FIG. 3B is a diagram showing a current non-output state;

FIG. 4A is a diagram showing a time when the polarity is normal, and FIG. 4B is a diagram showing a time when the polarity is inverted;

FIG. 7A is a diagram showing an ideal pseudo differential, and FIG. 7B is a diagram showing a pseudo differential whose gain is decreased by resistors;

FIGS. 12A and 12B are diagrams for explaining a relationship between a polarity control signal inputted and the polarity of the current outputted in each transconductance amplifier according to Embodiment 2 of the present invention, one is a diagram showing a time when the polarity is normal, and the other is a diagram showing a time when the polarity is inverted.

DESCRIPTION OF EMBODIMENTS

Hereafter, the preferred embodiments of the present invention will be explained in detail with reference to the drawings.

Embodiment 1

Figure 1:
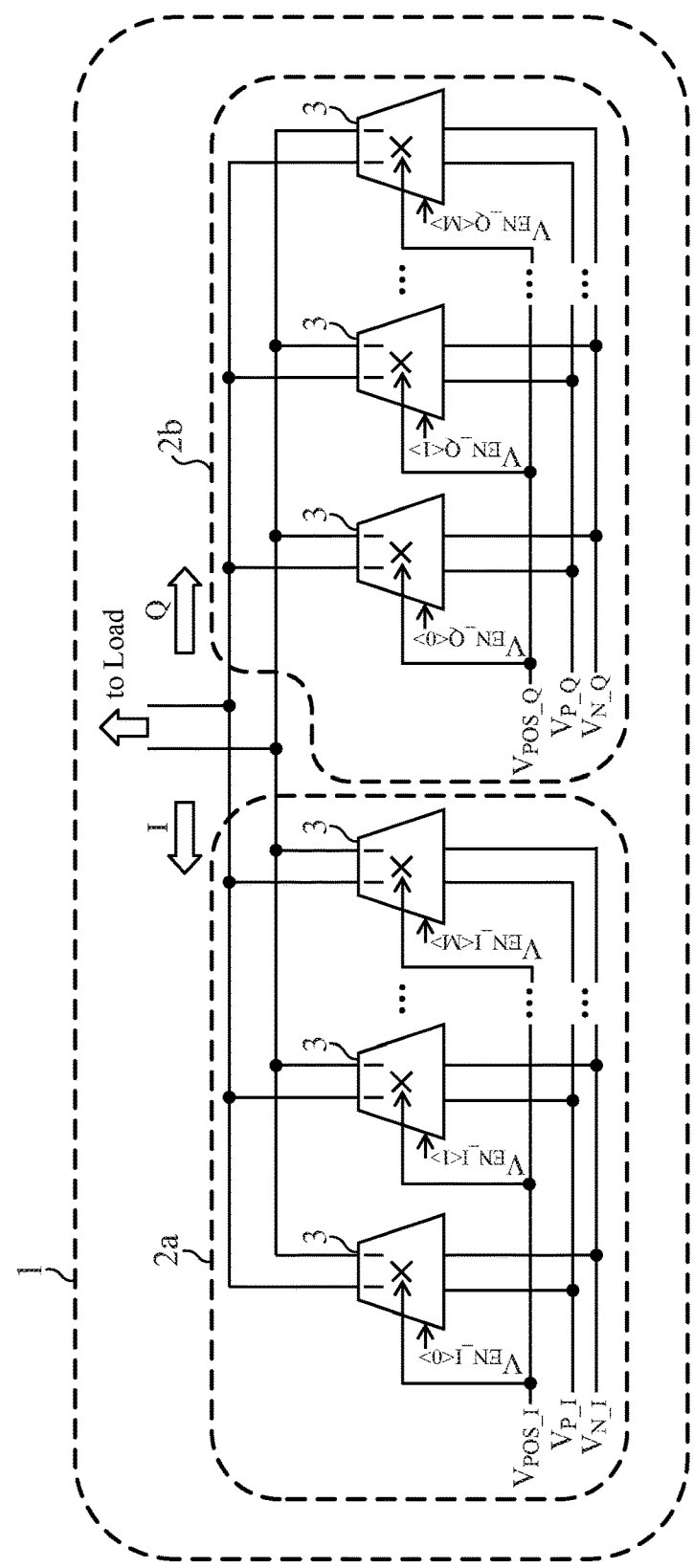
FIG. 1 is a diagram showing an example of the configuration of a phase shifter according to Embodiment 1 of the present invention.

FIG. 1 is a diagram showing an example of the configuration of a phase shifter 1 according to Embodiment 1 of the present invention.

The phase shifter 1 converts an input signal into a signal having an arbitrary phase in accordance with control signals based on control codes (an output-level control signal $V_{EN}$ and a polarity control signal $V_{POS}$ which will be mentioned below), and is of vector composite type. This phase shifter 1 includes a variable gain amplifier 2a and a variable gain amplifier 2b, as shown in FIG. 1. The variable gain amplifier 2a receives and processes complementary signals (a non-inverting input signal $V_{P\_I}$ and an inverting input signal $V_{N\_I}$) which are acquired by non-inverting and inverting an in-phase component (an I signal) of the input signal. Further, the variable gain amplifier 2b receives and processes complementary signals (a non-inverting input signal $V_{P\_Q}$ and an inverting input signal $V_{N\_Q}$) which are acquired by non-inverting and inverting a quadrature-phase component (a Q signal) of the input signal. The output of the variable gain amplifier 2a and the output of the variable gain amplifier 2b are connected to a common load.

Figure 2:
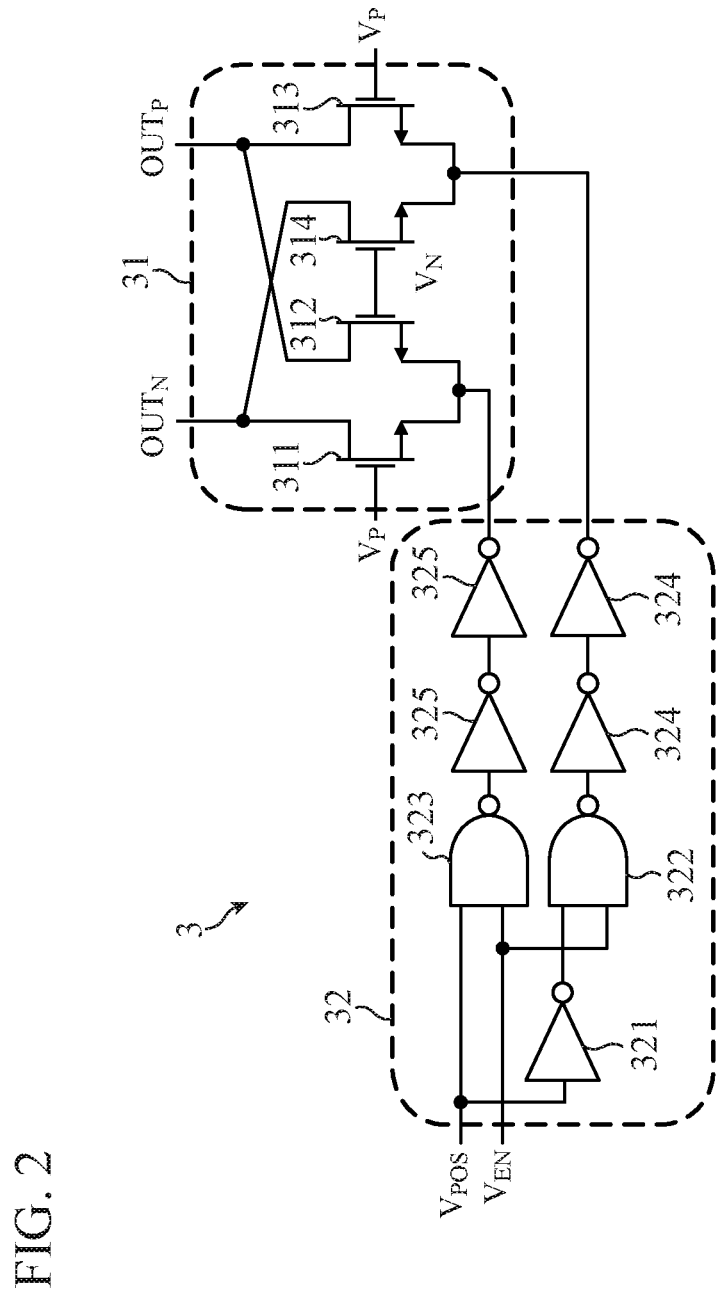
FIG. 2 is a diagram showing an example of the configuration of each transconductance amplifier according to Embodiment 1 of the present invention.

The variable gain amplifiers 2a and 2b have the same circuit configuration, and each of the variable gain amplifiers has plural transconductance amplifiers 3. Each transconductance amplifier 3 according to Embodiment 1 has a cross-coupled differential pair 31 and a control circuit 32, as shown in FIG. 2.

The cross-coupled differential pair 31 has a pair of transistors (differential pair transistor) which consists of transistors 311 and 312, and a pair of transistors (differential pair transistor) which consists of transistors 313 and 314.

The transistor 311 has a gate connected to a non-inverting input terminal (not illustrated). A non-inverting input signal $V_P$ is inputted to the non-inverting input terminal.

The transistor 312 has a gate connected to an inverting input terminal (not illustrated), and a drain connected to the drain of the transistor 313. An inverting input signal $V_N$ is inputted to the inverting input terminal.

The transistor 313 has a gate connected to the non-inverting input terminal.

The transistor 314 has a gate connected to the inverting input terminal, and a drain connected to the drain of the transistor 311.

The control circuit 32 is comprised of logical circuits, and has a function (output-level control function) of controlling the presence or absence of an output on the cross-coupled differential pair 31, and a function (polarity control function) of controlling the polarity of a signal to be outputted on the cross-coupled differential pair 31. The control circuit 32 according to Embodiment 1 outputs a binary signal to the common source of each of the differential pair transistors on the basis of the output-level control signal $V_{EN}$ and the polarity control signal $V_{POS}$ which are inputted thereto. The output-level control signal $V_{EN}$ is a binary signal (having an H level (power supply level) or an L level (ground level)) for controlling the presence or absence of the output of the cross-coupled differential pair 31. Further, the polarity control signal $V_{POS}$ is a binary signal (having an H level (power supply level) or an L level (ground level)) for controlling the polarity of the output of the cross-coupled differential pair 31.

This control circuit 32 has inverters (NOT circuits) 321, 324, and 325 and NAND circuits 322 and 323.

The inverter 321 is a circuit that implements logical negation to output a signal having an L level when a signal having an H level is inputted thereto, and output a signal having an H level when a signal having an L level is inputted thereto. As this inverter 321, an odd number of inverters are connected in series, and an input end of the inverters is connected to a polarity control terminal (not illustrated). The polarity control signal $V_{POS}$ is inputted to the polarity control terminal. A case in which the single inverter 321 is disposed is shown in FIG. 2.

The NAND circuit 322 is a circuit that implements NAND to output a signal having an L level when two signals having an H level are inputted thereto, and output a signal having an H level otherwise. This NAND circuit 322 has an input terminal connected to an output-level control terminal (not illustrated), and another input terminal connected to the output terminal of the inverter 321. The output-level control signal $V_{EN}$ is inputted to the output-level control terminal.

The NAND circuit 323 is a circuit that implements NAND to output a signal having an L level when two signals having an H level are inputted thereto, and output a signal having an H level otherwise. This NAND circuit 323 has an input terminal connected to the polarity control terminal, and another input terminal connected to the output-level control terminal.

Each inverter 324 is a circuit that implements logical negation to output a signal having an L level when a signal having an H level is inputted thereto, and output a signal having an H level when a signal having an L level is inputted thereto. As the inverters 324, an even number of inverters are connected in series, an input end of the inverters is connected to the output terminal of one of the NAND circuits (in the example of FIG. 2, the NAND circuit 322), and an output end of the inverters is connected to the common source of one of the differential pair transistors (in the example of FIG. 2, the transistors 313 and 314). A case in which the two inverters 324 are disposed is shown in FIG. 2.

Each inverter 325 is a circuit that implements logical negation to output a signal having an L level when a signal having an H level is inputted thereto, and output a signal having an H level when a signal having an L level is inputted thereto. As the inverters 325, an even number of inverters are connected in series, an input end of the inverters is connected to the output terminal of the other one of the NAND circuits (in the example of FIG. 2, the NAND circuit 323), and an output end of the inverters is connected to the common source of the other one of the differential pair transistors (in the example of FIG. 2, the transistors 311 and 312). A case in which the two inverters 325 are disposed is shown in FIG. 2.

Next, an example of the operation of the phase shifter 1 configured as above will be explained.

The phase shifter 1 according to Embodiment 1 amplifies the complementary signals (voltages) $V_{P\_I}$ and $V_{N\_I}$ of the in-phase component of an input signal and converts the complementary signals into a current by using the variable gain amplifier 2a, amplifies the complementary signals (voltages) $V_{P\_Q}$ and $V_{N\_Q}$ of the quadrature-phase component of the input signal and converts the complementary signals into a current by using the variable gain amplifier $2b$, and passes the currents through the load, thereby providing a voltage output, as shown in FIG. 1.

In this embodiment, the transconductance amplifiers 3 are controlled so as to enter either of two states, a current output presence state and a current output absence state, in accordance with output-level control signals $V_{EN\_I<0>}$ to $V_{EN\_I<M>}$ and $V_{EN\_Q<0>}$ to $V_{EN\_Q<M>}$. In accordance with a combination of the settings of these output-level control signals $V_{EN\_I<0>}$ to $V_{EN\_I<M>}$ and $V_{EN\_Q<0>}$ to $V_{EN\_Q<M>}$ the amplitude of the currents flowing through the load is controlled and gain control can be carried out.

Figure 3A:
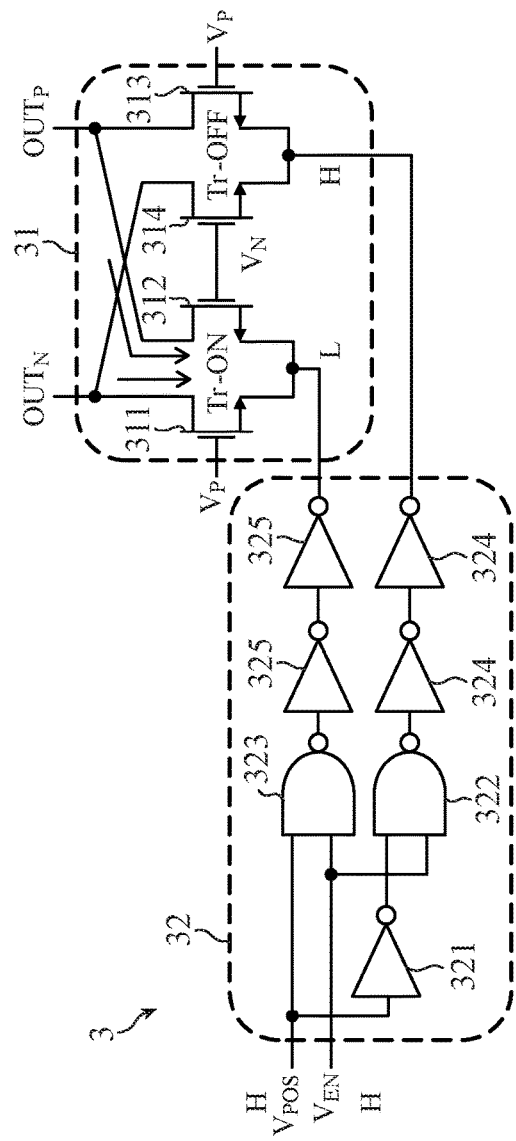
FIGS. 3A and 3B are diagrams for explaining a relationship between an output-level control signal inputted and a current outputted in each transconductance amplifier according to Embodiment 1 of the present invention.
Figure 3B:
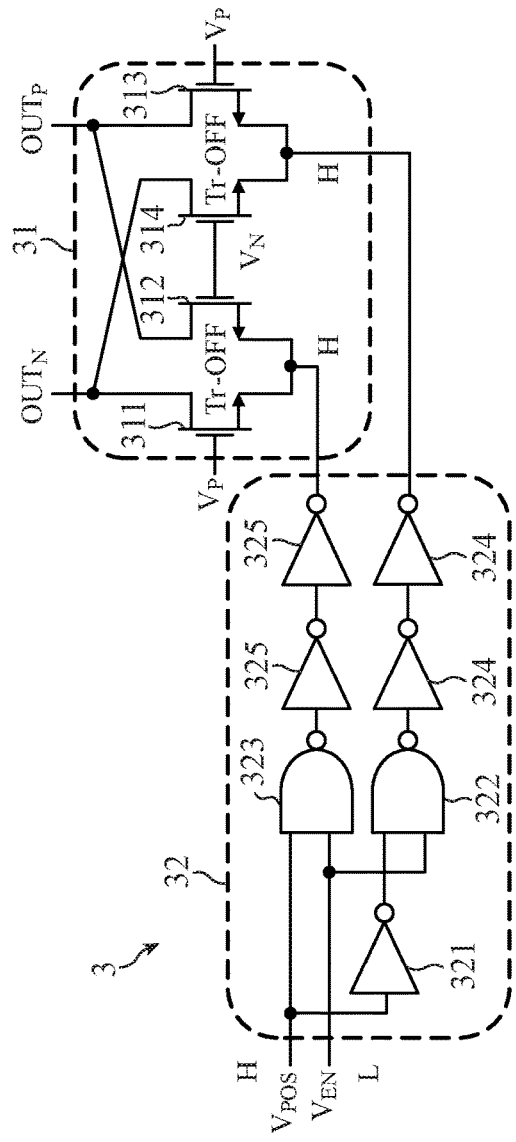

FIGS. 3A and 3B are diagrams for explaining a relationship between the output-level control signal $V_{EN}$ inputted and the current outputted in each transconductance amplifier 3, one is a diagram showing a current output state, and the other is a diagram showing a current non-output state. Although the polarity control signal $V_{POS}$ for determining the polarity of the output current is also inputted to each transconductance amplifier 3, an explanation will be made on the assumption that the polarity control signal $V_{POS}$ has an H level, because of no relation in the explanation with reference to FIGS. 3A and 3B is. It is further assumed that the complementary signals (non-inverting input signal $V_P$ and inverting input signal $V_N$) are applied to the non-inverting input terminal and the inverting input terminal.

As shown in FIG. 3A, at the time of the output-level control signal $V_{EN}$=H, the control circuit 32 causes the signal inputted to the common source of the differential pair transistor (transistors 311 and 312) on a left side of the cross-coupled differential pair 31 to have an L level. Therefore, each of these transistors 311 and 312 enters an on state, and a current flows through each of the transistors.

In contrast, as shown in FIG. 3B, at the time of the output-level control signal $V_{EN}$=L, the control circuit 32 causes the signal inputted to each of the common sources of both the differential pair transistors (transistors 311 to 314) of the cross-coupled differential pair 31 to have an H level. Therefore, all of the transistors 311 to 314 enter an off state, and no current flows through any of the transistors.

Figure 4A:
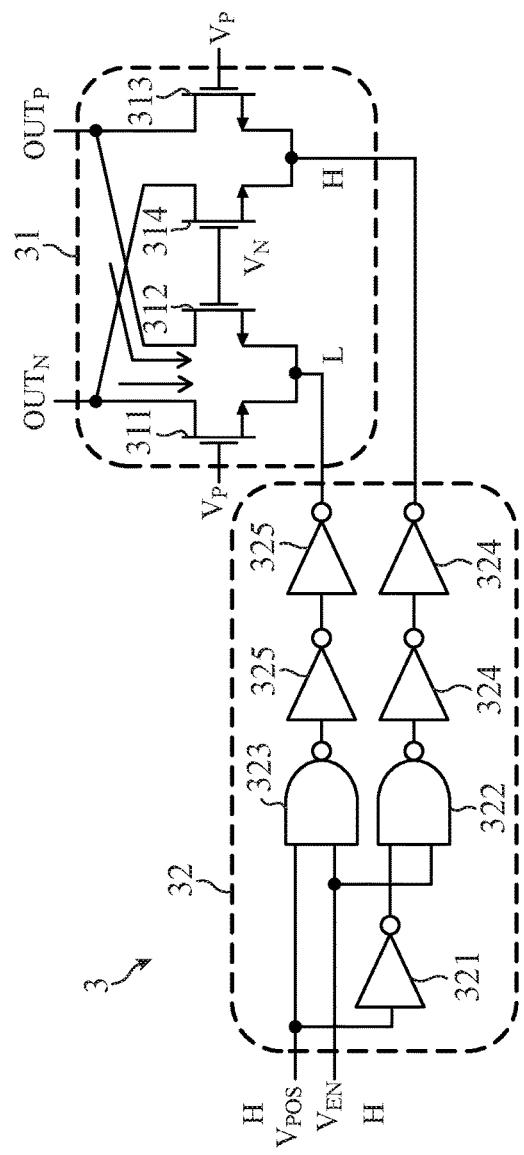
FIGS. 4A and 4B are diagrams for explaining a relationship between a polarity control signal inputted and the polarity of the current outputted in each transconductance amplifier according to Embodiment 1 of the present invention.
Figure 4B:
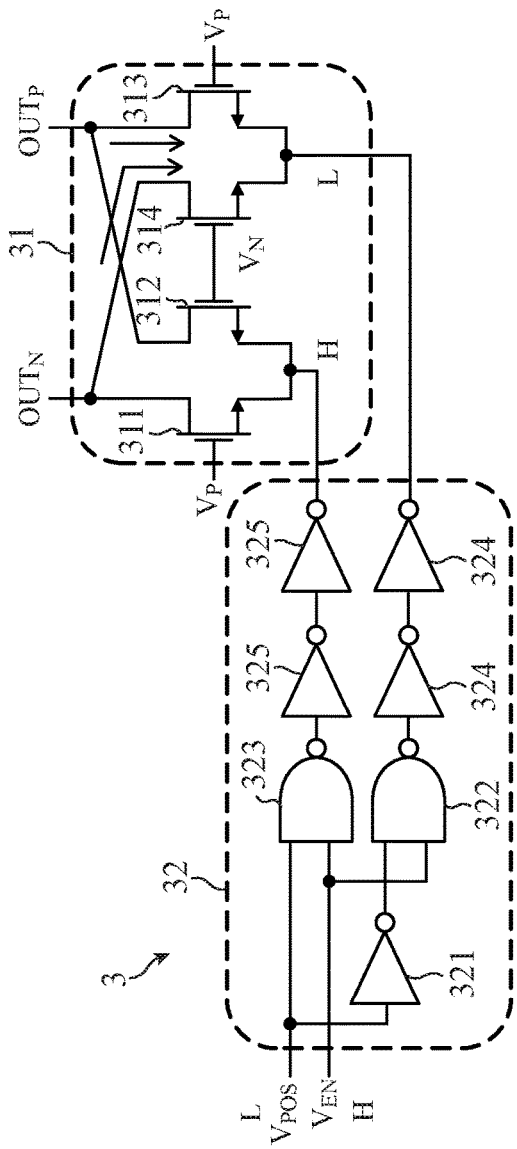

FIGS. 4A and 4B are diagrams for explaining a relationship between the polarity control signal $V_{POS}$ inputted and the polarity of the current outputted in each transconductance amplifier 3, one is a diagram showing a time when the polarity is normal, and the other is a diagram showing a time when the polarity is inverted. In FIGS. 4A and 4B, it is assumed that the output-level control signal $V_{EN}$=H. It is further assumed that the complementary signals (non-inverting input signal $V_P$ and inverting input signal $V_N$) are applied to the non-inverting input terminal and the inverting input terminal.

As shown in FIG. 4A, at the time of the polarity control signal $V_{POS}$=H, the control circuit 32 causes the signal inputted to the common source of the differential pair transistor (transistors 311 and 312) on a left side of the cross-coupled differential pair 31 to have an L level, and also causes the signal inputted to the common source of the differential pair transistor (transistors 313 and 314) on a right side of the cross-coupled differential pair to have an H level. Therefore, only the transistors 311 and 312 enter an on state and a current having a usual polarity flows through each of the transistors.

In contrast, as shown in FIG. 4B, at the time of the polarity control signal $V_{POS}$=L, the control circuit 32 causes the signal inputted to the common source of the differential pair transistor (transistors 311 and 312) on a left side of the cross-coupled differential pair 31 to have an H level, and also causes the signal inputted to the common source of the differential pair transistor (transistors 313 and 314) on a right side of the cross-coupled differential pair to have an L level. Therefore, only the transistors 313 and 314 enter an on state and a current having an inverted polarity flows through each of the transistors.

The amount of the phase shift of a signal appearing at the output of the phase shifter 1 is expressed by arctan(Q/I). Because I and Q can have positive or negative polarities, I and Q can have polarities in any of four quadrants when I and Q are expressed using a vector diagram. More specifically, in the phase shifter 1 according to the present invention, the amount of the phase shift can be controlled to within a range from 0 to 360 degrees.

Figure 5:
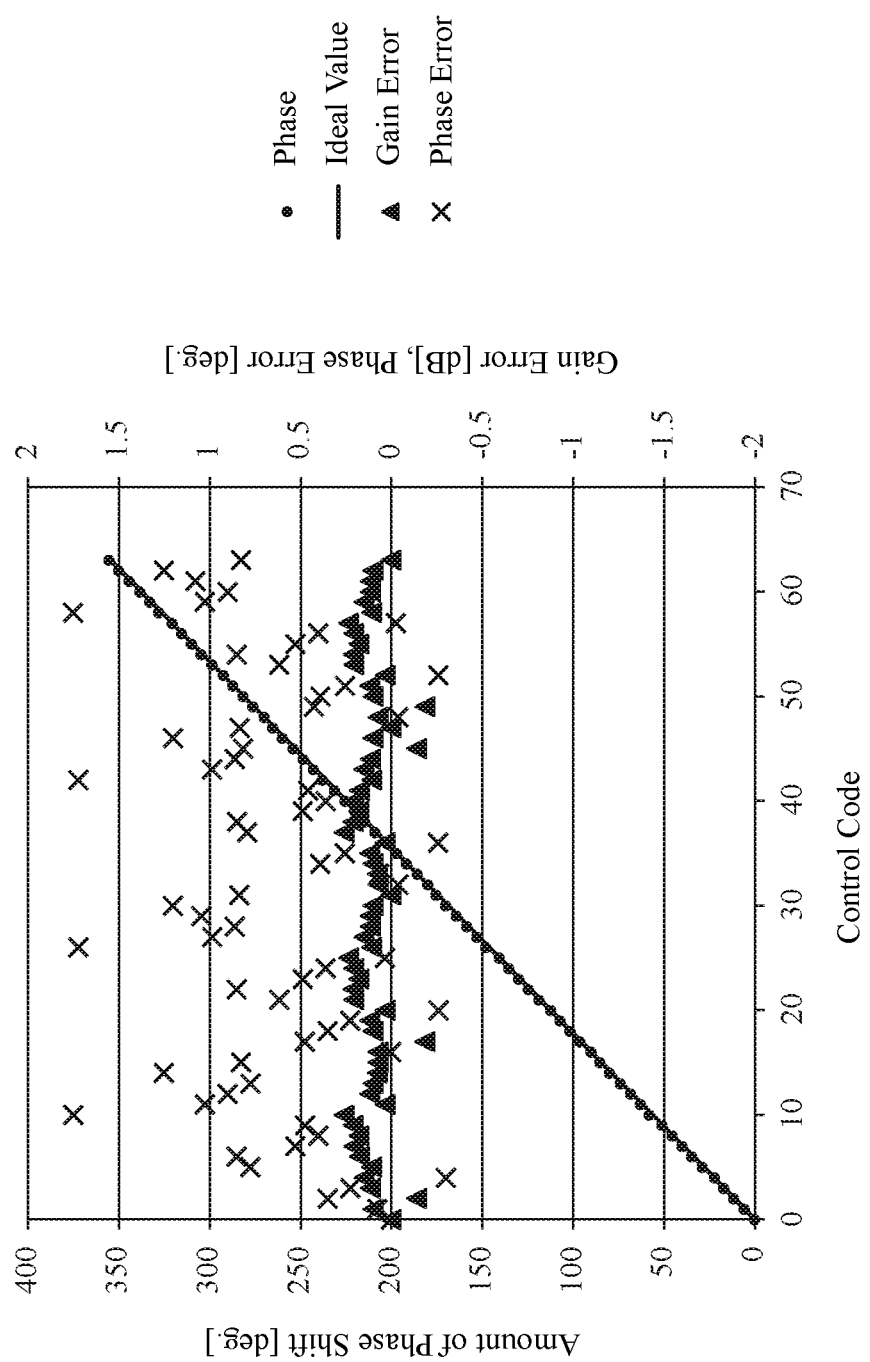
FIG. 5 is a diagram showing an example of phase shift control performed by the phase shifter according to Embodiment 1 of the present invention.

FIG. 5 shows an example of the phase shift control performed by the phase shifter 1 according to the present invention. In FIG. 5, the horizontal axis shows a control code indicating a phase state. Further, the left vertical axis shows the amount of the phase shift. It is ideal that the amount of the phase shift varies linearly with the control code. Further, it is desirable that the gain (not shown) is constant regardless of the control code. Further, the right vertical axis shows a gain error and a phase error from an ideal value.

Further, in the phase shifter 1 according to the present invention, the number of vertically stacked stages can be at least one, and the level of each source of the cross-coupled differential pair 31 can be reduced to a ground level. Therefore, the swing width of each drain voltage of the cross-coupled differential pair 31 can be widened and the linearity can be improved, as compared with conventional configurations.

In Embodiment 1, an even number of inverters 324 and an even number of inverters 325 are disposed between the NAND circuits 322 and 323 and the common sources of the cross-coupled differential pair 31. The reason why this configuration is provided will be explained below.

Transconductors (transconductance amplifiers) are roughly classified into two types of transconductors, fully-differential transconductors and pseudo differential transconductors.

Figure 6:
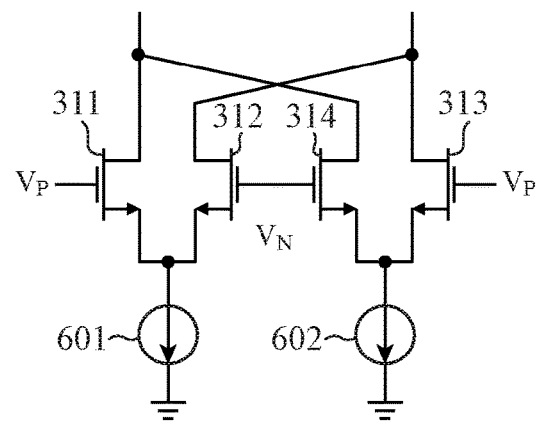
FIG. 6 is a diagram showing an example of the configuration of a fully-differential transconductor.

A fully-differential transconductor is one in which constant current sources 601 and 602 are connected to the common sources of differential pair transistors, as shown in FIG. 6. In many cases, each of the constant current sources 601 and 602 is comprised of transistors. Because this fully-differential transconductor is biased by the constant current sources 601 and 602, the current flowing through each of the differential pair transistors and the gain are determined by the constant current sources 601 and 602. However, because a voltage is required for each of the constant current sources 601 and 602 in the configuration of FIG. 6, as already mentioned, the swing width of each drain voltage decreases by the voltage.

Figure 7A:
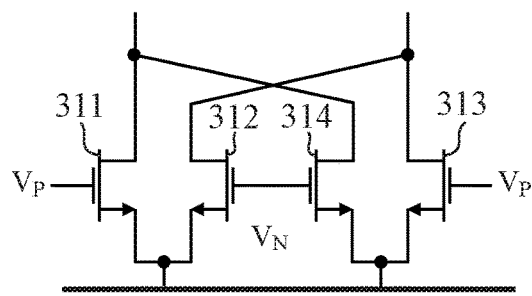
FIG. 7A and FIG. 7B are diagrams showing an example of the configuration of a pseudo differential transconductor.
Figure 7B:
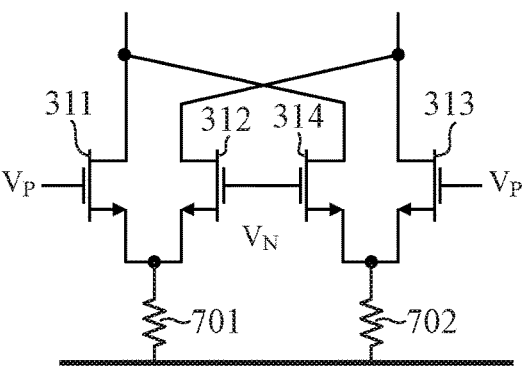

On the other hand, a pseudo differential transconductor as shown in FIG. 7A or 7B is used in the present invention as each of the transconductors. In this pseudo differential transconductor, each drain voltage can be made to have a large swing width. Further, in this pseudo differential transconductor, the current flowing through each of the differential pair transistors and the gain are determined by the DC voltages of the signals $V_P$ and $V_N$ provided for the gates. Therefore, for the DC voltages of the signals $V_P$ and $V_N$, in a case in which GND is connected directly to the common sources as shown in FIG. 7A, an intended current flows through each of the differential pair transistors and an intended gain is acquired. In contrast, in a case in which resistors 701 and 702 are disposed as shown in FIG. 7B, the current decreases and the intended gain is no longer acquired. This is a drawback of the pseudo differential transconductor.

Figure 8:
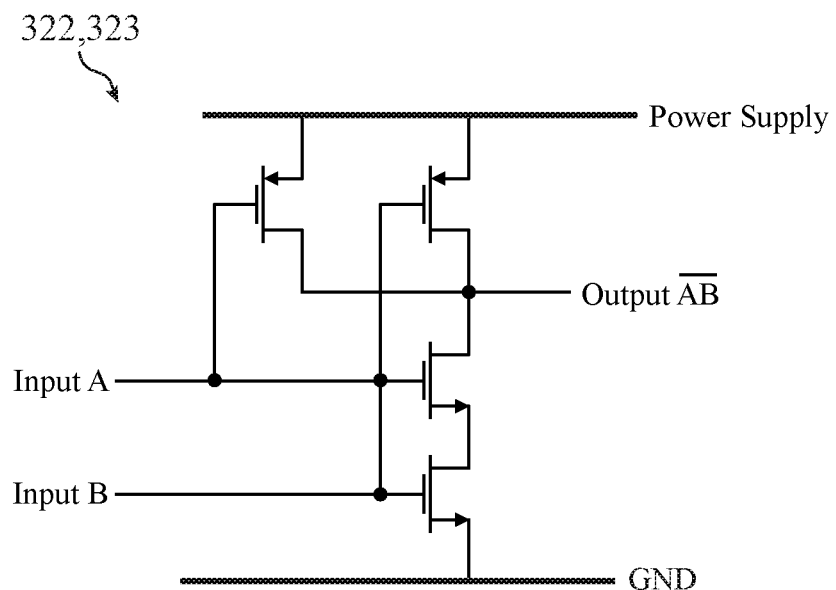
FIG. 8 is a diagram showing an example of the configuration of a NAND circuit.
Figure 9:
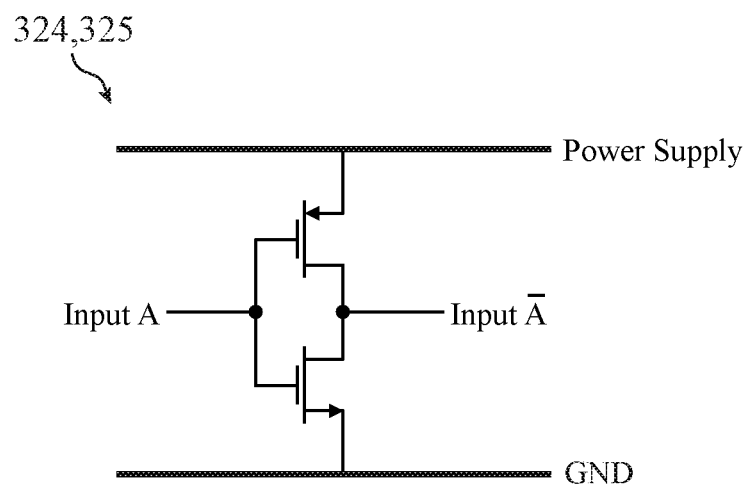
FIG. 9 is a diagram showing an example of the configuration of an inverter.

It is assumed hereafter that in the configuration shown in FIG. 2, the inverters 324 and 325 are removed, and the NAND circuits 322 and 323 are connected directly to the common sources of the cross-coupled differential pair 31. It is assumed that each of the NAND circuits 322 and 323 has a circuit configuration shown in FIG. 8, and each of the inverters 324 and 325 has a circuit configuration shown in FIG. 9.

When both two input signals inputted to the NAND circuits 322 and 323 have an H level, signals outputted from the NAND circuits 322 and 323 have an L level, and the common sources to which the outputs of the NAND circuits 322 and 323 are connected have an earth potential. However, as can be seen from FIG. 8, two NMOS transistors are stacked in each of the NAND circuits 322 and 323, the ON resistance of the transistors is twice as large as that of the inverter shown in FIG. 9. More specifically, the resistance value of each resistor shown in FIG. 7B for the same NMOS transistor is doubled, and the intended gain is no longer acquired (the gain decreases), as compared with the case, as shown in FIG. 2, in which the inverters 324 and 324 are disposed.

The above description is the reason why an even number of inverters 324 and an even number of inverters 325 are disposed between the NAND circuits 322 and 323 and the common sources of the cross-coupled differential pair 31.

As mentioned above, according to this Embodiment 1, the cross-coupled differential pair 31 having one set of differential pair transistors in which signals $V_P$ and $V_N$ whose polarities are opposite to each other are inputted to gates thereof, drains of one of the differential pair transistors being connected to drains of another one of the differential pair transistors, and the control circuit 32 comprised of logical circuits, for outputting a binary signal to each of the common sources of the differential pair transistors on the basis of an output-level control signal $V_{EN}$ and a polarity control signal $V_{POS}$ which are inputted thereto are disposed. Therefore, the swing width of each drain voltage of the amplification stage (cross-coupled differential pair 31) can be widened and the linearity can be improved, as compared with conventional configurations.

In the above-mentioned embodiment, the case in which the control circuit 32 is comprised of the inverters 321, 324, and 325 and the NAND circuits 322 and 323 is shown. However, no limitation to this example is intended, and two AND circuits can be used instead of the two NAND circuits 322 and 323. In the case of using AND circuits, an odd number of inverters 324 and an odd number of inverters 325 are disposed.

Embodiment 2

In Embodiment 2, another example of the configuration of each transconductance amplifier 3 will be shown. A phase shifter 1 according to Embodiment 2 has the same configuration as that of the configuration example according to Embodiment 1 shown in FIG. 1, except for the configuration of each transconductance amplifier 3, the explanation of the same configuration will be omitted hereafter.

Figure 10:
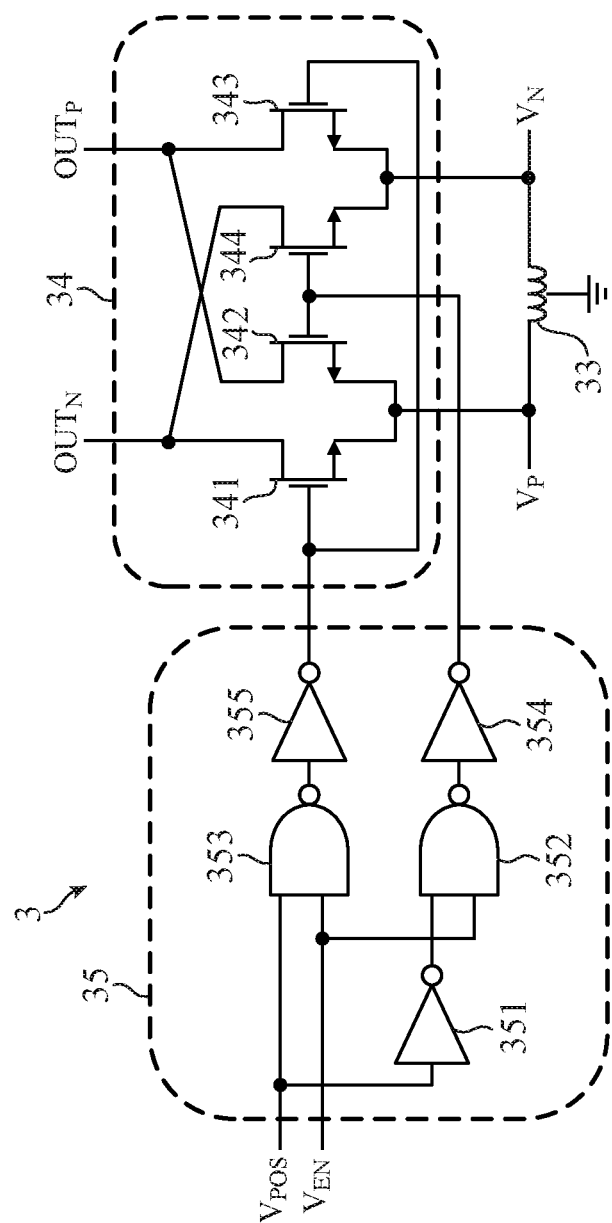
FIG. 10 is a diagram showing an example of the configuration of each transconductance amplifier according to Embodiment 2 of the present invention.

FIG. 10 is a diagram showing an example of the configuration of each transconductance amplifier 3 according to Embodiment 2 of the present invention.

Each transconductance amplifier 3 according to Embodiment 2 has an inductor 33, a cross-coupled differential pair 34, and a control circuit 35, as shown in FIG. 10.

The inductor 33 has an end connected to a non-inverting input terminal (not illustrated), another end connected to an inverting input terminal (not illustrated), and a center grounded. A non-inverting input signal $V_P$ is inputted to the non-inverting input terminal, and an inverting input signal $V_N$ is inputted to the inverting input terminal.

The cross-coupled differential pair 34 has a pair of transistors (differential pair transistor) which consists of transistors 341 and 342, and a pair of transistors (differential pair transistor) which consists of transistors 343 and 344.

The transistor 341 has a common source connected between the non-inverting input terminal and the end of the inductor 33.

The transistor 342 has a common source connected between the non-inverting input terminal and the end of the inductor 33, and the drain connected to the drain of the transistor 343.

The transistor 343 has a common source connected between the inverting input terminal and the other end of the inductor 33.

The transistor 344 has a common source connected between the inverting input terminal and the other end of the inductor 33, and the drain connected to the drain of the transistor 341.

The control circuit 35 is comprised of logical circuits, and has a function (output-level control function) of performing an operation of controlling the presence or absence of an output for the cross-coupled differential pair 34, and a function (polarity control function) of controlling the polarity of a signal to be outputted on the cross-coupled differential pair 34. The control circuit 35 according to Embodiment 2 outputs binary signals to the gates of each of the differential pair transistors on the basis of an output-level control signal $V_{EN}$ and a polarity control signal $V_{POS}$ which are inputted thereto. The output-level control signal $V_{EN}$ is a binary signal (having an H level (power supply level) or an L level (ground level)) for controlling the presence or absence of the output of the cross-coupled differential pair 34. Further, the polarity control signal $V_{POS}$ is a binary signal (having an H level (power supply level) or an L level (ground level)) for controlling the polarity of the output of the cross-coupled differential pair 34.

This control circuit 35 has inverters (NOT circuits) 351, 354, and 355 and NAND circuits 352 and 353.

The inverter 351 is a circuit that implements logical negation to output a signal having an L level when a signal having an H level is inputted thereto, and output a signal having an H level when a signal having an L level is inputted thereto. As this inverter 351, an odd number of inverters are connected in series, and an input end of the inverters is connected to a polarity control terminal (not illustrated). The polarity control signal $V_{POS}$ is inputted to the polarity control terminal. A case in which the single inverter 351 is disposed is shown in FIG. 10.

The NAND circuit 352 is a circuit that implements NAND to output a signal having an L level when two signals having an H level are inputted thereto, and output a signal having an H level otherwise. This NAND circuit 352 has an input terminal connected to an output-level control terminal (not illustrated), and another input terminal connected to the output terminal of the inverter 351. The output-level control signal $V_{EN}$ is inputted to the output-level control terminal.

The NAND circuit 353 is a circuit that implements NAND to output a signal having an L level when two signals having an H level are inputted thereto, and output a signal having an H level otherwise. This NAND circuit 353 has an input terminal connected to the polarity control terminal, and another input terminal connected to the output-level control terminal.

The inverter 354 is a circuit that implements logical negation to output a signal having an L level when a signal having an H level is inputted thereto, and output a signal having an H level when a signal having an L level is inputted thereto. As this inverter 354, an odd number of inverters are connected in series, an input end of the inverters is connected to the output terminal of one of the NAND circuits (in the example of FIG. 10, the NAND circuit 352), and an output end of the inverters is connected to a gate of each of the differential pair transistors (in the example of FIG. 10, the gates of the transistors 342 and 344). A case in which the single inverter 354 is disposed is shown in FIG. 10.

The inverter 355 is a circuit that implements logical negation to output a signal having an L level when a signal having an H level is inputted thereto, and output a signal having an H level when a signal having an L level is inputted thereto. As this inverter 355, an odd number of inverters are connected in series, an input end of the inverters is connected to the output terminal of the other one of the NAND circuits (in the example of FIG. 10, the NAND circuit 353), and an output end of the inverters is connected to the other gate of each of the differential pair transistors (in the example of FIG. 10, the gates of the transistors 341 and 343). A case in which the single inverter 355 is disposed is shown in FIG. 10.

Next, an example of the operation of the phase shifter 1 configured as above will be explained.

The phase shifter 1 according to Embodiment 2 amplifies the complementary signals (voltages) $V_{P\_I}$ and $V_{N\_I}$ of the in-phase component of an input signal and converts the complementary signals into a current by using a variable gain amplifier 2a, amplifies the complementary signals (voltages) $V_{P\_Q}$ and $V_{N\_Q}$ of the quadrature-phase component of the input signal and converts the complementary signals into a current by using a variable gain amplifier 2b, and passes the currents through a load, thereby providing a voltage output, as shown in FIG. 1, like in the case of that according to Embodiment 1.

In this embodiment, the transconductance amplifiers 3 are controlled so as to enter either of two states, a current output presence state and a current output absence state, in accordance with output-level control signals $V_{EN\_I<0>}$ to $V_{EN\_I<M>}$ and $V_{EN\_Q<0>}$ to $V_{EN\_Q<M>}$. In accordance with a combination of the settings of these output-level control signals $V_{EN\_I<0>}$ to $V_{EN\_I<M>}$ and $V_{EN\_Q<0>}$ to $V_{EN\_Q<M>}$, the amplitude of the currents flowing through the load is controlled and gain control can be carried out.

Figure 11A:
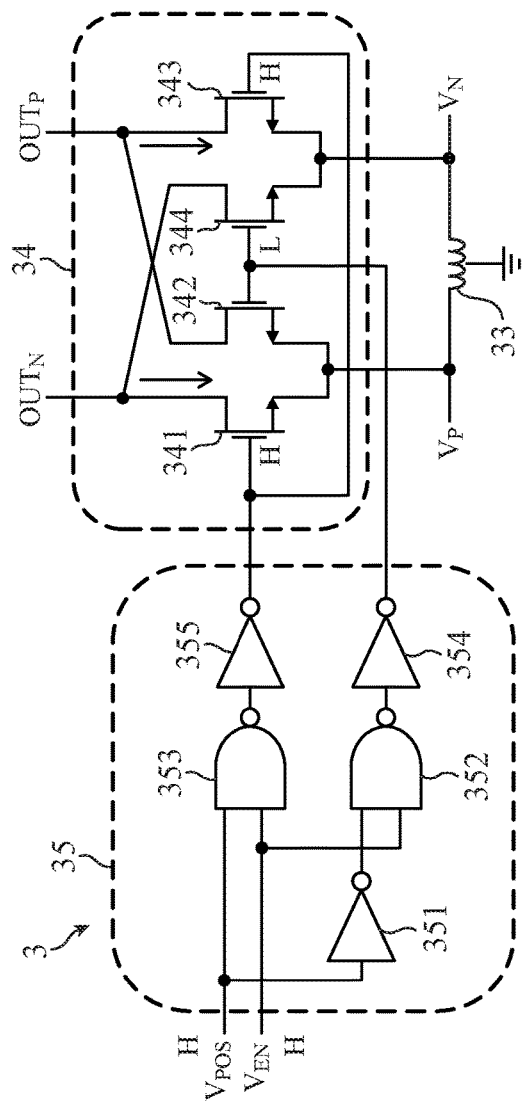
FIGS. 11A and 11B are diagrams for explaining a relationship between an output-level control signal inputted and a current outputted in each transconductance amplifier according to Embodiment 2 of the present invention, one is a diagram showing a current output state, and the other is a diagram showing a current non-output state.
Figure 11B:
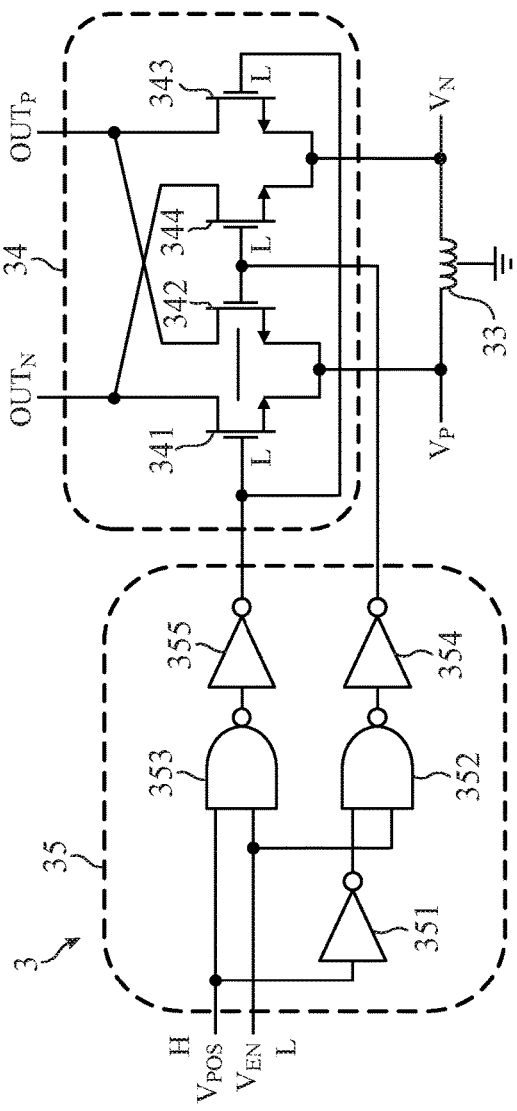

FIGS. 11A and 11B are diagrams for explaining a relationship between the output-level control signal $V_{EN}$ inputted and the current outputted in each transconductance amplifier 3, one is a diagram showing a current output state, and the other is a diagram showing a current non-output state. Although the polarity control signal $V_{POS}$ for determining the polarity of the output current is also inputted to each transconductance amplifier 3, an explanation will be made on the assumption that the polarity control signal $V_{POS}$ has an H level, because of no relation in the explanation with reference to FIGS. 11A and 11B. It is further assumed that the complementary signals (non-inverting input signal $V_P$ and inverting input signal $V_N$) are applied to the non-inverting input terminal and the inverting input terminal.

As shown in FIG. 11A, when the output-level control signal $V_{EN}$=H, the control circuit 35 causes the signal inputted to the gate of each of the transistors 341 and 343 of the cross-coupled differential pair 34 to have an H level. Therefore, each of these transistors 341 and 343 enters an on state, and a current flows through each of the transistors.

In contrast, as shown in FIG. 11B, when the output-level control signal $V_{EN}$=L, the control circuit 35 causes the signals inputted to the gates of all the transistors 341 to 344 of the cross-coupled differential pair 34 to have an L level. Therefore, all of the transistors 341 to 344 enter an off state, and no current flows through any of the transistors.

FIGS. 12A and 12B are diagrams for explaining a relationship between the polarity control signal $V_{POS}$ inputted and the polarity of the current outputted in each transconductance amplifier 3, one is a diagram showing a time when the polarity is normal, and the other is a diagram showing a time when the polarity is inverted. In FIGS. 12A and 12B, it is assumed that the output-level control signal $V_{EN}$=H. It is further assumed that the complementary signals (non-inverting input signal $V_P$ and inverting input signal $V_N$) are applied to the non-inverting input terminal and the inverting input terminal.

As shown in FIG. 12A, at the time of the polarity control signal $V_{POS}$=H, the control circuit 35 causes the signal inputted to the gates of the transistors 341 and 343 of the cross-coupled differential pair 34 to have an H level, and also causes the signal inputted to the gates of the transistors 342 and 344 to have an L level. Therefore, only the transistors 341 and 343 enter an on state and a current having a normal polarity flows through each of the transistors.

In contrast, as shown in FIG. 12B, at the time of the polarity control signal $V_{POS}$=L, the control circuit 35 causes the signal inputted to the gates of the transistor 342 and 344 of the cross-coupled differential pair 34 to have an H level, and also causes the signal inputted to the gates of the transistors 341 and 343 to have an L level. Therefore, only the transistors 342 and 344 enter anon state and a current having an inverted polarity flows through each of the transistors.

The amount of the phase shift of a signal appearing at the output of the phase shifter 1 is expressed by arctan (Q/I). Because I and Q can have positive or negative polarities, I and Q can have polarities in any of four quadrants when I and Q are expressed using a vector diagram. More specifically, in the phase shifter 1 according to the present invention, the amount of the phase shift can be controlled to within a range from 0 to 360 degrees.

Further, in the phase shifter 1 according to the present invention, the number of vertically stacked stages can be at least one. Therefore, the swing width of each drain voltage of the cross-coupled differential pair 34 can be widened and the linearity can be improved, as compared with conventional configurations.

As mentioned above, according to this Embodiment 2, the cross-coupled differential pair 34 having one set of differential pair transistors in which signals whose polarities are opposite to each other are inputted to common sources thereof, drains of one of the differential pair transistors being connected to drains of another one of the differential pair transistors, and the control circuit 35 comprised of logical circuits, for outputting binary signals to the gates of each of the differential pair transistors on the basis of an output-level control signal $V_{EN}$ and a polarity control signal $V_{POS}$ which are inputted thereto are disposed. Therefore, the swing width of each drain voltage of the amplification stage (cross-coupled differential pair 34) can be widened and the linearity can be improved, as compared with conventional configurations. Further, in the configuration according to Embodiment 2, the number of inverters can be reduced as compared with the configuration according to Embodiment 1.

In the above-mentioned embodiment, the case in which the control circuit 35 is comprised of the inverters 351, 354, and 355 and the NAND circuits 352 and 353 is shown. However, this embodiment is not limited to this example, and two AND circuits can be used instead of the two NAND circuits 352 and 353. In the case of using AND circuits, an even number of inverters 354 and an even number of inverters 355 are disposed.

Further, the reason why an even number of inverters 354 and an even number of inverters 355 are disposed between the AND circuits and the cross-coupled differential pair 34 is the same as that mentioned in Embodiment 1.

Within the scope of the invention, an arbitrary combination of two or more of the above-mentioned embodiments can be made, various changes can be made in an arbitrary component according to any one of the above-mentioned embodiments, and an arbitrary component according to any one of the above-mentioned embodiments can be omitted.

INDUSTRIAL APPLICABILITY

The transconductance amplifier according to the present invention can widen the swing width of each drain voltage of the amplification stage and can improve the linearity as compared with conventional configurations, and is suitable for use as a transconductance amplifier having an output-level control function and a polarity control function, and for use in a phase shifter or the like using transconductance amplifiers.

REFERENCE SIGNS LIST

1: a phase shifter; 2a, 2b: variable gain amplifiers; 3: a transconductance amplifier; 31, 34: cross-coupled differential pairs; 32, 35: control circuits; 33: an inductor; 311 to 314, 341 to 344: transistors; 321, 324, 325, 341, 344, 345: inverters (NOT circuits); 322, 323, 342, 343: NAND circuits; 601, 602: constant current sources; and 701, 702: resistors.

The invention claimed is:

1. A transconductance amplifier comprising:
a cross-coupled differential pair having one set of differential pair transistors in which signals whose polarities are opposite to each other are inputted to gates thereof, drains of one of the differential pair transistors being connected to drains of another one of the differential pair transistors; and
a control circuit comprised of logical circuits, for outputting binary signals to common sources of the respective differential pair transistors on a basis of an output-level control signal and a polarity control signal which are inputted thereto, the output-level control signal being a binary signal for controlling presence or absence of an output of the cross-coupled differential pair and the polarity control signal being a binary signal for controlling a polarity of the output of the cross-coupled differential pair, wherein:
the control circuit includes NOT circuits that are connected to the common sources of the differential pair transistors, respectively; and
each of the NOT circuits is an inverter that includes
an NMOS transistor having a first source connected to GND, and having a first drain connected to one of the common sources, and
a PMOS transistor having a second source connected to a power supply, and having a second drain connected to the first drain.

2. A transconductance amplifier comprising:
a cross-coupled differential pair having one set of differential pair transistors in which signals whose polarities are opposite to each other are inputted to gates thereof, drains of one of the differential pair transistors being connected to drains of another one of the differential pair transistor; and
a control circuit comprised of logical circuits, for outputting binary signals to common sources of the respective differential pair transistors on a basis of an output-level control signal and a polarity control signal which are inputted thereto, the output-level control signal being a binary signal for controlling presence or absence of an output of the cross-coupled differential pair and the polarity control signal being a binary signal controlling polarity fo the output of the cross-coupled differential pair, wherein the control circuit has:
an odd number of NOT circuits connected in series and receiving the polarity control signal inputted thereto;
a NAND circuit for receiving both the output-level control signal and an output of the NOT circuits which are inputted thereto;
a NAND circuit for receiving both the polarity control signal and the output-level control signal which are inputted thereto;
an even number of NOT circuits connected in series for receiving an output of one of the NAND circuits which is inputted thereto, an output end thereof being connected to the common source of one of the differential pair transistors; and
an even number of NOT circuits connected in series for receiving an output of another one of the NAND circuits which is inputted thereto, an output end thereof being connected to the common source of another one of the differential pair transistors.

3. A transconductance amplifier comprising:
a cross-coupled differential pair having one set of differential pair transistors in which signals whose polarities are opposite to each other are inputted to gates thereof, drains of one of the differential pair transistors being connected to drains of another one of the differential pair transistors; and
a control circuit comprised of logical circuits, for outputting binary signals to common sources of the respective differential pair transistors on a basis of an output-level control signal and a polarity control signal which are inputted thereto, the output-level control signal being a binary signal for controlling presence or absence of an output of the cross-coupled differential pair and the polarity control signal being a binary signal for controlling a polarity of the output of the cross-coupled differential pair, wherein the control circuit has:
an odd number of NOT circuits connected in series for receiving the polarity control signal inputted thereto;
an AND circuit for receiving both the output-level control signal and an output of the NOT circuits which are inputted thereto;
an AND circuit for receiving both the polarity control signal and the output-level control signal which are inputted thereto;

an odd number of NOT circuits connected in series for receiving an output of one of the AND circuits which is inputted thereto, an output end thereof being connected to the common source of one of the differential pair transistors; and an odd number of NOT circuits connected in series for receiving an output of another one of the AND circuits which is inputted thereto, an output end thereof being connected to the common source of another one of the differential pair transistors.

4. A transconductance amplifier comprising:

a cross-coupled differential pair having one set of differential pair transistors in which signals whose polarities are opposite to each other are inputted to gates thereof, drains of one of the differential pair transistors being connected to drains of another one of the differential pair transistors; and a control circuit comprised of logical circuits, for outputting binary signals to common sources of the respective differential pair transistors on a basis of an output-level control signal and a polarity control signal which are inputted thereto, the output-level control signal being a binary signal for controlling presence or absence of an output of the cross-coupled differential pair and the polarity control signal being a binary signal for controlling a polarity of the output of the cross-coupled differential pair, wherein the control circuit has:

an odd number of NOT circuits connected in series for receiving the polarity control signal inputted thereto;

a NAND circuit for receiving both the output-level control signal and an output of the NOT circuits which are inputted thereto;

a NAND circuit for receiving both the polarity control signal and the output-level control signal which are inputted thereto;

an odd number of NOT circuits connected in series for receiving an output of one of the NAND circuits which is inputted thereto, an output end thereof being connected to corresponding gates of the differential pair transistors; and an odd number of NOT circuits connected in series for receiving an output of another one of the NAND circuits which is inputted thereto, an output end thereof being connected to other corresponding gates of the differential pair transistors.

5. A transconductance amplifier comprising:

a cross-coupled differential pair having one set of differential pair transistors in which signals whose polarities are opposite to each other are inputted to gates thereof, drains of one of the differential pair transistors being connected to drains of another one of the differential pair transistors; and a control circuit comprised of logical circuits, for outputting binary signals to common sources of the respective differential pair transistors on a basis of an output-level control signal and a polarity control signal which are inputted thereto, the output-level control signal being a binary signal for controlling presence or absence of an output of the cross-coupled differential pair and the polarity control signal being a binary signal for controlling a polarity of the output of the cross-coupled differential pair, wherein the control circuit has:

an odd number of NOT circuits connected in series for receiving the polarity control signal inputted thereto;

an AND circuit for receiving both the output-level control signal and an output of the NOT circuits which are inputted thereto;

an AND circuit for receiving both the polarity control signal and the output-level control signal which are inputted thereto;

an even number of NOT circuits connected in series for receiving an output of one of the AND circuits which is inputted thereto, an output end thereof being connected to corresponding gates of the differential pair transistors; and an even number of NOT circuits connected in series for receiving an output of another one of the AND circuits which is inputted thereto, an output end thereof being connected to other corresponding gates of the differential pair transistors.

6. A phase shifter comprising:

a variable gain amplifier having plural transconductance amplifiers according to claim 2, each using, as signals whose polarities are inverted relative to one another, a signal which is an in-phase component of an input signal, and another signal whose polarity is inverted relative to the signal; and a variable gain amplifier having plural transconductance amplifiers according to claim 2, each using, as signals whose polarities are inverted relative to one another, a signal which is a quadrature-phase component of the input signal, and another signal whose polarity is inverted relative to the signal.

7. A phase shifter comprising:

a variable gain amplifier having plural transconductance amplifiers according to claim 4, each using, as signals whose polarities are inverted relative to one another, a signal which is an in-phase component of an input signal, and another signal whose polarity is inverted relative to the signal; and a variable gain amplifier having plural transconductance amplifiers according to claim 4, each using, as signals whose polarities are inverted relative to one another, a signal which is a quadrature-phase component of the input signal, and another signal whose polarity is inverted relative to the signal.

8. A phase shifter comprising:

a variable gain amplifier having plural transconductance amplifiers according to claim 3, each using, as signals whose polarities are inverted relative to one another, a signal which is an in-phase component of an input signal, and another signal whose polarity is inverted relative to the signal; and a variable gain amplifier having plural transconductance amplifiers according to claim 3, each using, as signals whose polarities are inverted relative to one another, a signal which is a quadrature-phase component of the input signal, and another signal whose polarity is inverted relative to the signal.

9. A phase shifter comprising:

a variable gain amplifier having plural transconductance amplifiers according to claim 5, each using, as signals whose polarities are inverted relative to one another, a signal which is an in-phase component of an input signal, and another signal whose polarity is inverted relative to the signal; and a variable gain amplifier having plural transconductance amplifiers according to claim 5, each using, as signals whose polarities are inverted relative to one another, a signal which is a quadrature-phase component of the input signal, and another signal whose polarity is inverted relative to the signal.

* * * * *